United States Patent
Chen et al.

(10) Patent No.: US 6,753,202 B2
(45) Date of Patent: Jun. 22, 2004

(54) CMOS PHOTODIODE HAVING REDUCED DARK CURRENT AND IMPROVED LIGHT SENSITIVITY AND RESPONSIVITY

(75) Inventors: Zhiliang J. Chen, Plano, TX (US); Kuok Y. Ling, Plano, TX (US); Hisashi Shichijo, Plano, TX (US); Katsuo Komatsuzaki, Ibaraki (JP); Chin-Yu Tsai, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/446,910

(22) Filed: May 28, 2003

(65) Prior Publication Data

US 2003/0230704 A1 Dec. 18, 2003

Related U.S. Application Data

(62) Division of application No. 09/848,637, filed on May 3, 2001, now Pat. No. 6,621,064.

(51) Int. Cl.⁷ ............................................. H01L 21/00
(52) U.S. Cl. ......................... 438/48; 257/292; 257/431; 257/465
(58) Field of Search ............................ 438/48; 257/292, 257/431, 465; 250/214.1

(56) References Cited

U.S. PATENT DOCUMENTS

| | | | | | |
|---|---|---|---|---|---|
| 4,831,430 A | * | 5/1989 | Umeji | ......................... | 257/463 |
| 6,026,964 A | * | 2/2000 | Hook et al. | .................. | 257/292 |
| 6,078,211 A | * | 6/2000 | Kalnitsky et al. | ........... | 327/534 |
| 6,392,263 B1 | * | 5/2002 | Chen et al. | .................. | 257/292 |

* cited by examiner

Primary Examiner—David Nelms
Assistant Examiner—Tu-Tu Ho
(74) Attorney, Agent, or Firm—W. James Brady, III; Frederick J. Telecky, Jr.

(57) ABSTRACT

A method for the fabrication of a light-sensing diode in a high-resistivity semiconductor substrate. A high-energy implant of ions into the substrate is patterned to form an annular well of the same conductivity type as the substrate; followed by a second high-energy implant of the opposite conductivity type, within the center of the annulus; followed by a third implant, of lower energy and high dosage, to form a region of the first conductivity type extending laterally near the substrate surface. The resulting diode junction is thereby patterned to include two planes near the substrate surface, allowing incident light to traverse the junction twice.

10 Claims, 3 Drawing Sheets

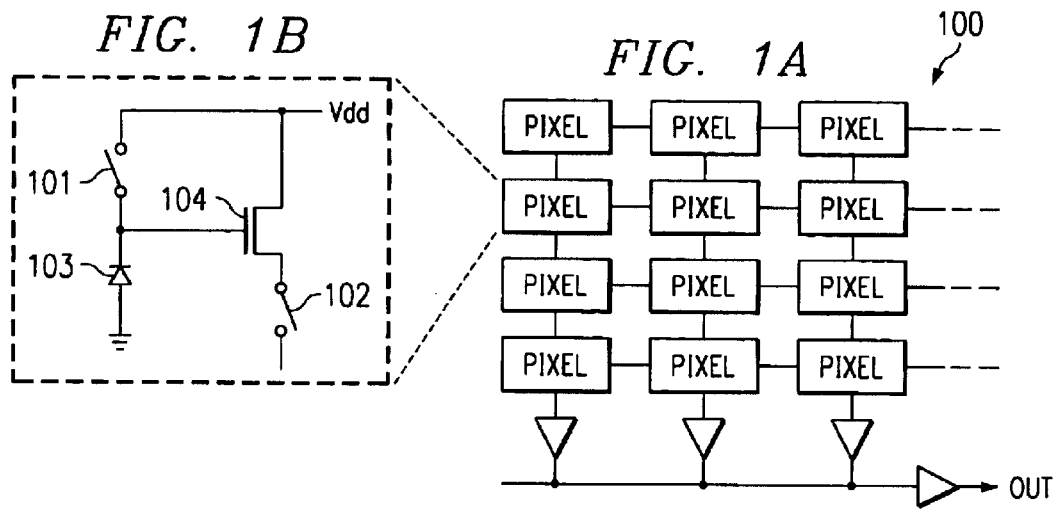
FIG. 1B
FIG. 1A
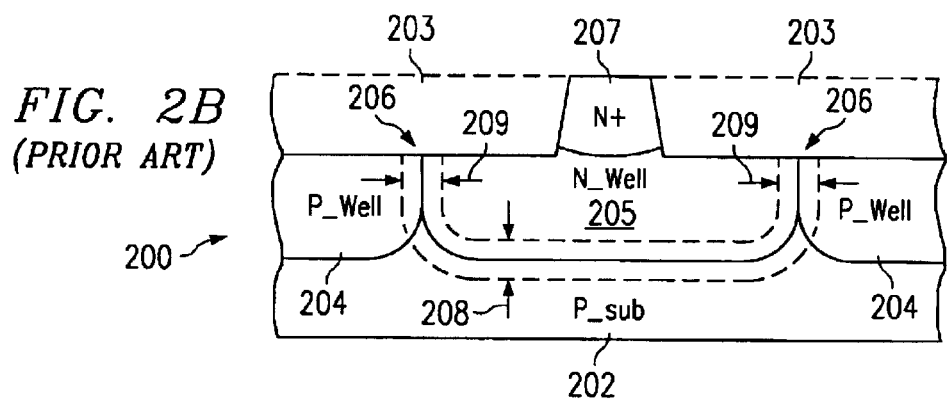
FIG. 2A
FIG. 2B
(PRIOR ART)
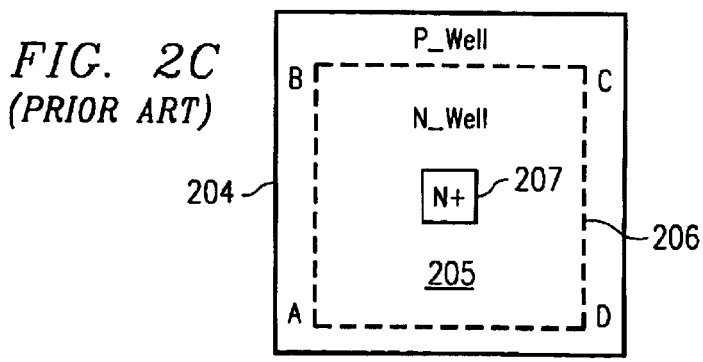
FIG. 2C
(PRIOR ART)

CMOS PHOTODIODE HAVING REDUCED DARK CURRENT AND IMPROVED LIGHT SENSITIVITY AND RESPONSIVITY

This application is a Division of U.S. Ser. No. 09/848,637 filed May 3, 2000, now U.S. Pat. No. 6,621,064.

FIELD OF THE INVENTION

The present invention is related in general to the field of electronic systems and semiconductor devices, and more specifically to photodiodes fabricated by the CMOS technology, yet having reduced dark current and improved light sensitivity and responsivity.

DESCRIPTION OF THE RELATED ART

Digital imaging devices are becoming increasingly popular in a variety of applications such as digital cameras, fingerprint recognition, and digital scanners and copiers. Typical prior art digital imaging devices are based on Charge Coupled Device (CCD) technology. CCD devices have an array of CCD cells, each cell comprising a pixel. Each CCD pixel outputs a voltage signal proportionate to the intensity of light impinging upon the cell. This analog voltage signal can be converted to a digital signal for further processing, digital filtering, and storage. As is well known in the art, a two-dimensional digital image can be constructed from the voltage signal outputs created by a two-dimensional array of CCD cells, commonly referred to as a sensor array.

CCD arrays have the shortcoming that the CCD fabrication requires a special process flow, which is not compatible with the standard CMOS process flow dominating today's manufacturing technology due to its flexibility and low cost. Consequently, the CCD array cannot be easily integrated with other logic circuits, such as CCD control logic and analog-to-digital converters. Additionally, in operation, a CCD array requires multiple high voltage supplies from 5 V to 12 V, and tends to consume a large amount of power.

CMOS technology has recently been considered for imager application. CMOS area (or 2-dimensional) sensor arrays can be fabricated in standard CMOS process and thus other system functions, such as controller, analog-to-digital, signal processor, and digital signal processor, can be integrated on the same chip. CMOS area array sensors (or CMOS imagers) can operate with a single low supply voltage such as 3.3 V or 5.0 V. The cost of CMOS processing is also lower than that of CCD processing. The power consumption of a CMOS sensor is lower than that of a CCD sensor.

In order to fabricate photodiodes and pixels in CMOS technology, however, a number of problems have to be overcome, foremost the unacceptably high level of reverse bias leakage or "dark" current of the photodiodes. This reverse bias or dark current is dominated by generation current in the junction depletion region. This current is proportional to the depletion width and the intrinsic carrier concentration, and inverse proportional to the recombination lifetime. Methods to reduce the dark current include lowering the temperature, or operating at lower supply voltage, or reducing the recombination/generation centers in the depletion region. The latter option is the most promising.

The recombination/generation centers originate mainly from lattice defects introduced during processing, especially
implant damage not annealed by subsequent thermal treatment;
damage induced by reactive ion etching (such as gate poly-silicon and shallow trench isolation etching);
stress-induced defects, for instance at STI edges;

surface states, prominently
electron traps at the Si-SiO2 interface;
depletion region extending to and including the silicon surface directly under the oxide;

impurities, for example
dopants and
metal contamination primarily from silicide.

In known technology, a number of approaches have been described to minimize at least several of these origins and thus reduce the dark current. In U.S. Pat. No. 5,625,210, issued Apr. 29, 1997 (Lee et al., "Active Pixel Sensor Integrated with a Pinned Photodiode"), extends the concept of a pinned photodiode, known in CCD technology, by integrating it into the image sensing element of an active pixel sensor, fabricated in CMOS technology. An additional first implant creates a photodiode by implanting a deeper n+ dopant than used by the source and drain implants, increasing the photo-response. An additional pinning layer implant, using high doses of a low energy p+ dopant, is then created near the surface; this pinning layer is not in electrical contact with the p-epitaxial layer over the p-substrate. This approach has many additional process steps and is too expensive for mass production.

Other approaches to reduce the dark current have been described at technical conferences such as ISSCC 1999, ISSCC 2000, and IEDM 2000. These approaches include optimizing the shallow trench liner oxidation in order to minimize defects at the active edge, blocking silicide, annealing with hydrogen in order to passivate defects, varying anneal cycles and well junction depths. Non of these efforts were completely satisfactory, especially with respect to minimum number of process steps and low cost manufacturing.

The challenge of cost reduction implies a drive for minimizing the number of process steps, especially a minimum number of photomask steps, and the application of standardized process conditions wherever possible. These constraints should be kept in mind when additional process steps or new process conditions are proposed to reduce photodiode dark current and improve light sensitivity and responsivity without sacrificing any desirable device characteristics. An urgent need has, therefore, arisen for a coherent, low-cost method of reducing dark current in photodiodes fabricated by CMOS technology. The device structure should further provide excellent light responsivity and sensitivity in the red as well as the blue spectrum, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

A light-sensing diode is fabricated in a high resistivity semiconductor substrate of a first conductivity type, the substrate having a surface protected by an insulator, comprising a first well of the opposite conductivity type in the substrate, forming a junction with the substrate remote from the surface, the well further having sidewall portions;

a second well of the first conductivity type fabricated in the substrate, at least partially surrounding the sidewalls of the first well, thereby forming a junction with the first well;

the second well further having at least one extension along the surface under the insulator into the first well, thereby buried near-the-surface junctions with the first well and constricting the surface area within which the junction intersect the surface; and contacts for applying electrical bias across the junctions.

The invention applies to semiconductors both of p-type and n-type as "first" conductivity types; preferably, the semiconductors are in the 1 to 50 Ωcom resistivity range. The semiconductor may consist of an epitaxial layer deposited on higher conductivity substrate material.

It is an aspect of the invention that the image-capturing device is fabricated with standard CMOS technology and the dark (leakage) current reduced by producing a buried junction, away from the surface, without an extra process step by utilizing the p-well implant. The invention thus reduces leakage current created by the junction perimeter intercepting the surface by reducing the effect of surface-related traps, dangling bonds, recombination/generation centers, and other surface effects creating leakage.

Another aspect of the invention is that the method is fully compatible with deep sub-micron CMOS technology, such as 0.18 μm and smaller.

Another aspect of the invention is that the concept of creating buried near-the-surface junctions and thus reducing the effect of surface-related leakage caused by traps, dangling bonds, and recombination/generation centers can be extended to any type of semiconductor diode, for example diodes used in memory circuits.

It is an essential aspect of the present invention that the shallow compensating p-well in the n-well can be created without an additional ion implant step by using the general p-well implant. The design of the location and periphery of the remaining n-well is flexible.

Another aspect of the invention is that the compensating p-well increases the total junction depletion region of the photodiode. Consequently, more carriers are generated in the photodiode per incident light, resulting in a more sensitive photodiode.

Another aspect of the invention is that the newly created compensating p-well/n-well junction is near and about parallel to the surface. Consequently, an increased responsivity to the short wavelength spectrum is created.

It is a technical advantage of the present invention that the dopant concentrations and the junction depths of the compensating p-well, the n-well, and/or the p-well and p-substrate can be manufactured according to predetermined device and process modeling, and are thus very flexible.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1A depicts schematically a 2-dimensional CMOS sensor array.

FIG. 1B shows the layout of an individual pixel of the array in FIG. 1A, highlighting the location of the light-sensing diode.

FIG. 2A is a symbol for light-sensing diode/photodiode.

FIG. 2B is a schematic cross section of a typical photodiode in deep sub-micron CMOS known technology.

FIG. 2C is a schematic top view of the photodiode depicted in FIG. 2B in CMOS known technology.

DETAILED DESCRIPTION OF THE PREFERRED EMBODIMENTS

Figure 3A:
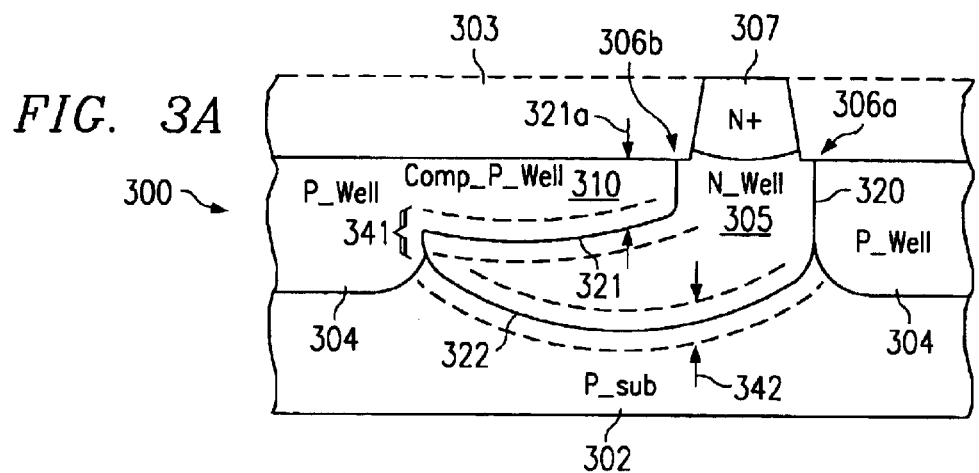
FIG. 3A is a schematic cross section of a preferred embodiment of a photodiode in deep sub-micron CMOS technology according to the present invention.

FIG. 1A is a schematic example of a 2-dimensional CMOS sensor array and pixel scheme, generally designated 100. FIG. 1B, an insert to FIG. 1A, illustrates a layout of an individual pixel. The pixel reset switch is designated as 101 and the pixel select switch as 102. During reset operation, the reset switch 101 is closed and the photodiode 103 is then biased up to Vdd. During the light sensing period, the reset switch 101 is open. The photodiode voltage Vdd will be decreased, due to the photodiode charge being discharged by carriers generated from an incident light. The change of photodiode voltage is thus measured by a sensing NMOS transistor 104 by closing the reset switch 103.

The impact of the present invention can be most easily appreciated by highlighting the shortcomings of the known technology. In FIG. 2A, the symbol 201 of the light-sensing diode, or photodiode, is repeated. In FIG. 2B, the cross section of a photodiode, as fabricated by conventional deep sub-micron CMOS technology, is schematically illustrated. The photodiode, generally designated 200, uses p-type silicon substrate 202. An insulating layer 203 of shallow trench isolation (STI) protects one surface of substrate 202. Into substrate 202 has been fabricated a p-well 204, which surrounds an n-well 205. The junctions between p-well 204 and n-well 205 intersect the surface, protected by the insulator 203, along line 206. A heavily n-doped region 207 enables electrical contact to n-well 205.

When electrical reverse bias is applied to photodiode 200, space charge, or depletion, regions are formed at the junctions. In FIG. 2B, one of these depletion regions 208 is schematically indicated at the n-well/p-substrate junction. Incident light generates carriers mostly inside a depletion region of a photodiode p-n junction. These carriers are in the form of electron-hole pairs, which react to the influence of the electric field (E-field) in the depletion region. The generated electrons are swept in the positive E-field direction, the holes in the opposite direction. For a given incident light (wavelength, amplitude), the wider the depletion region, the more carriers the photodiode can collect, thus the better the sensitivity of the photodiode.

Actual CMOS photodiodes have junction leakage current, so-called dark current. This leakage/dark current will eventually discharge a photodiode and change the photodiode voltage even without any incident light. Dark current increases sensor noise level and consequently reduces sensor sensitivity as well as dynamic range. With the feature size of advanced CMOS technology continuously scaling down, the high doping of n-well and n-diffusion leads to a high dark current.

FIG. 2B further indicates depletion regions 209 at the n-well/p-well peripheral junctions. Since the n-well/p-well junctions touch the STI surface at 206, most of the junction leakage current of depletion region 209, and thus of the photodiode, originates from surface junction leakage.

In the schematic top view of the photodiode in FIG. 2C, the n-well 205 with its contact region 207 is shown surrounded by the p-well 204 and the periphery A-B-C-D of the junction intersect 206 with the surface under the STI layer (not indicated in FIG. 2C). The surface junction leakage current is proportional to the peripheral length A-B-C-D of intersect 206, and the perimeter is large relative to the area it encloses in the sub-micron technology. Consequently, the perimeter leakage current dominates the area leakage current. The concept of the present invention greatly reduces the surface junction and its photodiode dark current by introducing a compensating p-well extension into the n-well directly under and parallel to the surface.

FIG. 3A is a schematic cross section of a photodiode according to the preferred embodiment of the present invention. The photodiode, generally designated 300, uses a silicon substrate 302 of a "first conductivity" type. In the example of FIG. 3A, this "first conductivity" is p-type.

As defined herein, the term "substrate" refers to the starting semiconductor wafer. As shown in FIG. 3A, in present manufacturing, the substrate typically has p-type doping. For clarity, this case is also selected as the basis for the following discussions. It should be stressed, however, that the invention and all description also cover the case where the substrate has n-type doping. In FIG. 3A, the substrate is designated 302. Frequently, but not necessarily, an epitaxial layer of the same conductivity type as the substrate has been deposited over the substrate; in this case the term "substrate" refers to epitaxial layer plus starting semiconductor.

An insulating layer 303 of shallow trench isolation (STI) protects one surface of substrate 302. Into substrate 302 has been fabricated a well 304 of the same conductivity type (p-type in FIG. 3A), which surrounds a well 305 of the opposite conductivity type (n-type in FIG. 3A). Only in a restricted region intersect the junctions 320 between p-well 304 and n-well 505 the surface, protected by the insulator 303, along the minimal line 306a. A heavily n-doped region 307 enables electrical contact to n-well 305.

As FIG. 3A shows, the well 304 of the first conductivity type (p-type) has at least one extension 310 (also p-type) along the surface under the insulator 303 into the well 305 of the opposite conductivity type (n-type). Extension 310 may be called a "compensating p-well", since it is p-doped to overcompensate the n-doping of well 305. This compensating p-well 310 forms buried, near-the-surface junctions 321 with well 305. Junctions 321 are approximately parallel to the semiconductor surface and insulator layer 303. Practical distances 321a of junction 321 from the surface with the STI layer have been manufactured in the 0.5 to 1.0 μm range.

With the geometry of compensating well 310, junctions extend in two different planes under the semiconductor surface, oriented approximately parallel to the surface: Junction 321 of the compensating p-well 310 with n-well 305, and junction 322 of the n-well 305 with p-substrate 302.

Figure 3B:
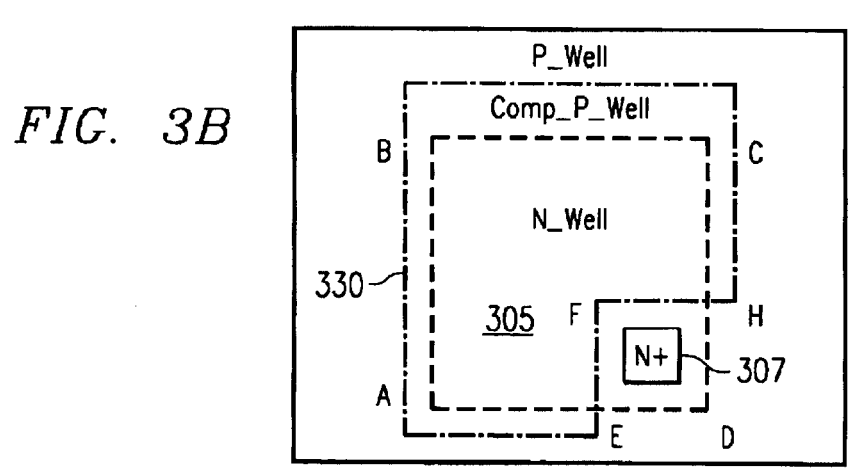
FIG. 3B is a schematic top view of the photodiode depicted in FIG. 3A, illustrating a preferred embodiment of the invention.

Junction 321 of the compensating p-well 310 intersects the surface under the insulating layer 303 at line 306b, minimizing the surface junction. The schematic top view of the photodiode in FIG. 3B illustrates this dramatic reduction of surface junction. The farthest extent of the (mostly buried) n-well 305 is indicated by the dotted line A-B-C-D. The compensating p-well extension is indicated by the dashed line 330. As FIG. 3B depicts, it is designed so that only a small area surrounded by points D-E-F-H remains of the n-well to reach the surface under the STI layer (not indicated in FIG. 3B). This remaining n-well area surrounds n-well contact region 307.

As FIG. 3B demonstrates, the compensating p-well of the invention eliminates the largest portion of the surface junction and thus diminishes the total photodiode leakage/dark current. It is important, however, to strongly emphasize that this decimation of surface-generated junction leakage current can not only be achieved for photodiodes, but for any integrated semiconductor diode which is plagued by surface-generated junction leakage. Any such diode can be improved by burying the junction away from the surface (by a distance 0.5 to 1.0 μm, or smaller, or larger) following the teachings of this invention. Examples are diodes used in semiconductor memory devices.

When electrical reverse bias is applied to photodiode 300, space charge/depletion regions are formed at the junctions. At junction 321, depletion region 341 is formed, at the junction 322, depletion region 342. As FIG. 3A demonstrates, the total junction depletion region of the photodiode is significantly increased, compared to the conventional diode in FIG. 2B. Consequently, more carriers can be generated in the photodiode for a give incident light, resulting in a more sensitive photodiode.

In addition, due to the proximity of junction 321 to the semiconductor surface, the responsivity of the photodiode 300 to the shorter wavelength spectrum is improved.

Figure 4:
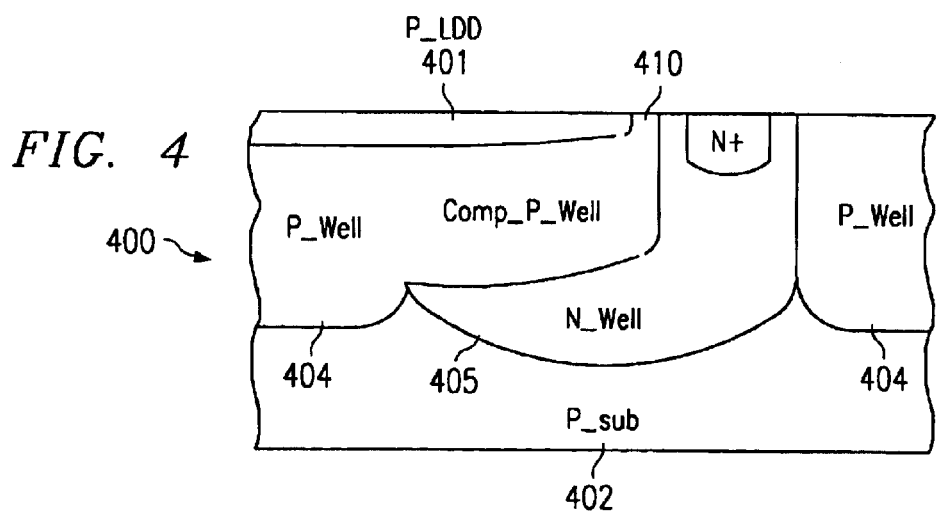
FIG. 4 is a schematic cross section of an alternative embodiment of a photodiode in deep sub-micron CMOS technology according to the present invention.

Another embodiment of a photodiode according to the present invention, suitable for higher operating voltages and increased sensitivity towards longer wavelengths, is illustrated in the schematic cross section of FIG. 4 and generally designated 400. In contrast to FIG. 3A, no insulating layer of shallow trench isolation (STI) is used. Instead, a silicide block is used in order to prevent silicidation. A lightly doped drain (LDD) p-implant 401 is thus available for the compensating p-well 410. Without the STI, all wells: the p-well 404, the n-well 405, and the compensating p-well 410, are deeper in the substrate 402. Consequently, the photodiode spectrum peak is shifted towards longer wavelengths. Furthermore, the relatively highly p-doped LDD 401 prevents the compensating p-well 410 from fully depleting when the n-well 405 is biased by high voltages.

The fabrication of the compensating p-well in deep submicron CMOS technology does not necessarily require extra process steps. In some twin well CMOS processes, the p-well concentration is higher than the n-well concentration near the silicon surface, and the n-well concentration is higher than the p-well concentration deeper below the silicon surface. In such cases, the n-well is first formed, and an opening is then made in the p-well mask over the photodiode n-well. This opening of the n-well receives then the same p-well implants as the core p-well regions, resulting in the formation of the compensating p-wells.

Figure 5A:
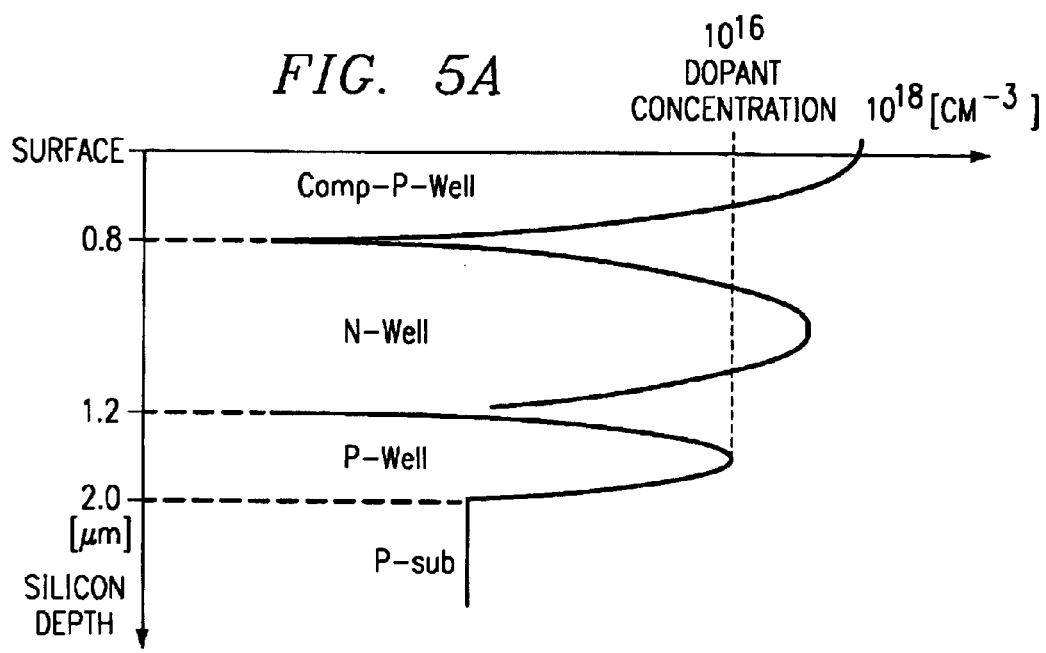
FIG. 5A illustrates schematically the doping profile of the first embodiment of a photodiode according to the invention.

FIG. 5A illustrates schematically the doping profile of the first embodiment of a photodiode fabricated according to the invention process described above. The doping concentrations and the junction depths shown are only examples and can be modified, as is well understood by persons skilled in the art.

Figure 5B:
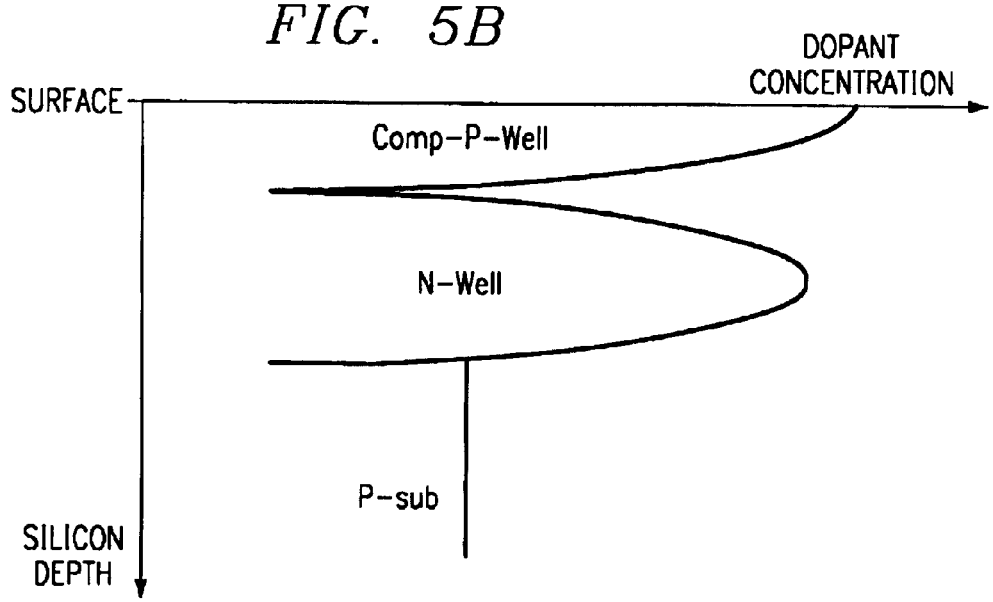
FIG. 5B illustrates schematically the doping profile of the second embodiment of a photodiode according to the invention.

FIG. 5B illustrates schematically the doping profile of the second embodiment of a photodiode fabricated according to the invention and obtained by using the p-substrate directly and omitting the p-well of FIG. 5A.

The preferred method of fabricating a light-sensing diode, having minimal surface-generated junction leakage current, in a high resistivity semiconductor substrate of a first conductivity type, comprising the following steps:

forming protective isolation regions into the surface of selected portions of the semiconductor;

implanting, at 20 to 380 keV, ions of the first conductivity type into the semiconductor to form a well of the first conductivity type shaped as an annulus such that a selected central portion of the semiconductor remains unimplanted;

implanting, at 50 to 700 keV, ions of the opposite conductivity type into the central portion to form a well having side walls surrounded by the well of the first conductivity type;

implanting, at 20 to 160 keV and 1·10E12 to 5·10E13 cm-2 dose, ions of the first conductivity type into at least one selected portion of the well of the opposite conductivity type to form, under and near the surface, a region of compensated conductivity, thereby extending along the surface under the insulator the well of the first conductivity;

rapidly annealing the ion implants;

depositing over portions of the surface a layer of insulating material suitable as gate dielectric;

forming gates of poly-silicon or other conductive material deposited onto the insulating layer;

forming source and drain regions to complete the diode; and forming contact metallizations at the source and drain regions.

The sequence of the ion implant steps can be executed in any order; they can be reversed from the order given above.

For the more general application of fabricating a semiconductor diode having minimal surface-generated junction leakage current, the preferred method comprises the steps of:

providing a high resistivity semiconductor substrate of a first conductivity type, the substrate having an insulated surface;

forming a first well of the opposite conductivity type in the substrate to form a junction within the substrate remote from the surface, and further creating well sidewall portions having junctions which reach the surface under said insulator, thereby defining the surface area portion of the first well;

forming a second well of the first conductivity type in the substrate, the second well having at least one extension into the first well along the surface under the insulator well, creating buried near-the-surface junctions, as well as sidewall junctions, with the first well, thereby constricting the first well surface area; and forming contacts for applying electrical bias across the junctions.

The first and second wells are formed in a process flow according to CMOS technology ion implant and diffusion steps.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. One example is the choice between p- or n-type dopants for the first conductivity type. Another example is the diodes used in logic and analog circuits as candidates for suppressing surface-induced leakage currents. It is therefore intended that the appended claims encompass any such modifications or embodiments.

We claim:

1. A method of fabricating a light-sensing diode, having minimal surface-generated junction leakage current, in a high resistivity semiconductor substrate of a first conductivity type comprising the steps of:

forming protective isolation regions into the surface of selected portion of said semiconductor;

implanting, at high energy, ions of said first conductivity type into said semiconductor to form a well of said first conductivity type shaped as an annulus such that a selected central portion of said semiconductor remains unimplanted;

implanting, at high energy, ions of the opposite conductivity type into said central portion to form a well having side walls surrounded by said well of said first conductivity type;

implanting, at low energy and high dose, ions of said first conductivity type into at least one selected portion of said well of said opposite conductivity type to form, under and near said surface, a region of compensated conductivity, thereby extending along said surface under said insulator said well of said first conductivity;

rapidly annealing said ion implants;

depositing over said surface a layer of insulating material suitable as gate dielectric;

forming gates of poly-silicon or other conductive material deposited onto said insulating layer;

forming source and drain regions to complete said diode; and forming contact metallizations at said source and drain regions.

2. The method according to claim 1 wherein said first conductivity type is p-type.

3. The method according to claim 1 wherein said ion implant of said first conductivity type is one or more p-type implant in the energy range from about 20 to 380 keV.

4. The method according to claim 1 wherein said ion implant of said opposite conductivity type is one or more n-type implant in the energy range from about 50 to 700 keV.

5. The method according to claim 1 wherein said compensating ion implant is a p-type implant in the energy range from about 20 to 160 keV and with a dose between about 1·10E12 and 5·10E13 cm−2 to overcompensate the n-well doping and to create a p-type region, thereby extending the p-well;

6. The method according to claim 1 wherein the sequence of said implant steps of ions of the first and opposite conductivity types is reversed.

7. The method according to claim 1 wherein the sequence of said implant steps of opposite conductivity type ions and low energy ions is reversed.

8. A method of fabricating a semiconductor diode having minimal surface-generated junction leakage current, comprising the steps of:

providing a high resistivity semiconductor substrate of a first conductivity type, said substrate having an insulated surface;

forming a first well of the opposite conductivity type in said substrate to form a junction within said substrate remote from said surface, and further creating well sidewall portions having junctions which reach said surface under said insulator, thereby defining the surface area portion of said first first well;

forming a second well of said first conductivity type in said substrate, said second well having at least one extension into said first well along said surface under said insulator well, creating buried near-the surface junctions, as well as sidewall junctions, with said first well, thereby constricting said first well surface area;

and forming contacts for applying electrical bias across said junctions.

9. The method according to claim 8 wherein said first and second wells are formed in a process flow according to CMOS technology ion implant and diffusion steps.

10. The method according to claim 8 applied to a light-sensing diode operable to provide an electrical potential difference to said contacts, creating reverse bias at said remote and near-the-surface junctions.

* * * * *